United States Patent [19]
Grass et al.

[11] Patent Number: 5,952,739
[45] Date of Patent: Sep. 14, 1999

[54] REMOTELY OPERATED METER DISCONNECT SWITCH

[75] Inventors: William Ernest Grass, Sussex; Earl Thomas Piber, Oconomowoc, both of Wis.

[73] Assignee: Eaton Corporation, Cleveland, Ohio

[21] Appl. No.: 09/066,492

[22] Filed: Apr. 24, 1998

[51] Int. Cl.[6] .................................................... H02P 3/00
[52] U.S. Cl. .................... 307/126; 307/122; 379/106.03; 379/305; 323/256; 323/341; 318/466; 318/468; 200/51.17
[58] Field of Search ................................. 307/126, 122; 379/106.03, 305; 323/256, 341; 318/282, 453, 454, 466, 468; 200/51.17

[56] References Cited

U.S. PATENT DOCUMENTS

| | | | |
|---|---|---|---|
| 3,553,376 | 1/1971 | Bogaart | 379/106.3 |
| 3,745,836 | 7/1973 | Seitz | 74/2 |
| 3,809,312 | 5/1974 | Warrick et al. | 235/30 |
| 5,028,853 | 7/1991 | Brown et al. | 307/122 |
| 5,296,788 | 3/1994 | Betton et al. | 318/282 |

*Primary Examiner*—Albert W. Paladini
*Attorney, Agent, or Firm*—Martin J. Moran

[57] ABSTRACT

Multiple pairs of stationary and moveable contacts are toggled simultaneously between an open and closed position to disconnect or connect a meter from or to a line power source, by a reciprocating operator driven by low power clock motor. The operator is connected to the contacts through a series of pivotally coupled toggle links that are spring biased to maintain the contacts in either of two stable states, open or closed. The disconnect switch is housed as a modular unit that is interposed between the meter socket and the meter. The switch is remotely actuated and cycles the motor through a pre-determined number of degrees of rotation sufficient to change the state of the contacts.

14 Claims, 5 Drawing Sheets

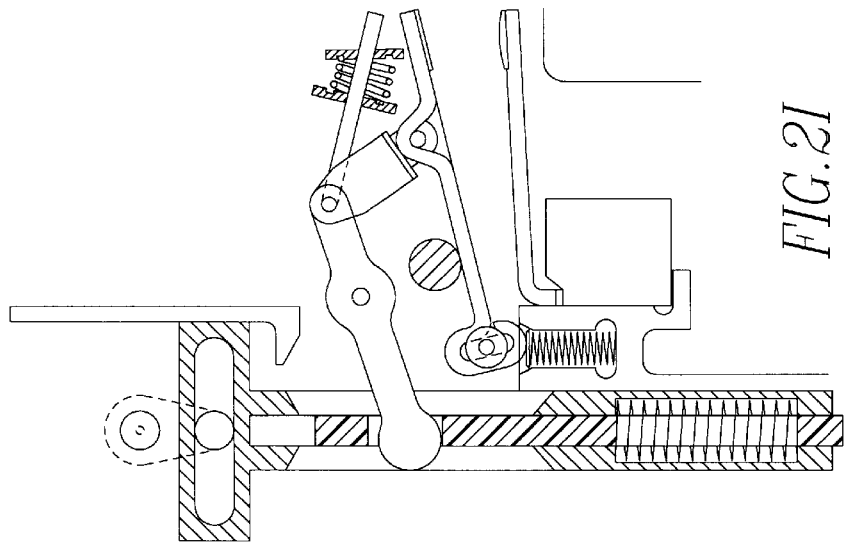
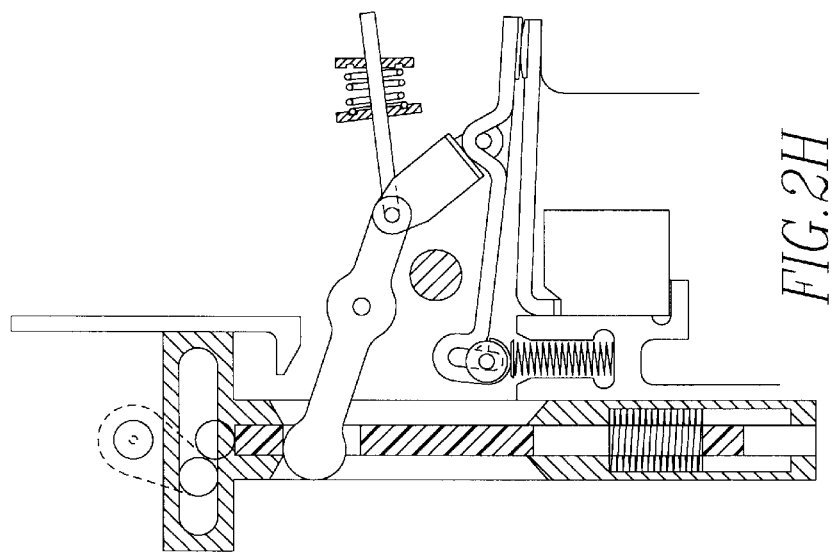
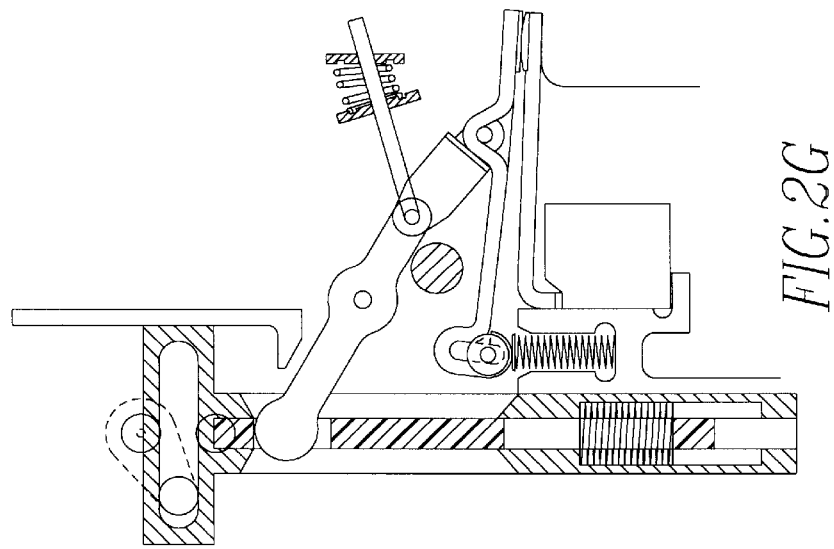

REMOTELY OPERATED METER DISCONNECT SWITCH

BACKGROUND OF THE INVENTION

1. Field of the Invention

This invention relates generally to disconnect switches for meters and, more particularly, to remotely actuated switches that operate at low power levels.

2. Background Information

There are a number of reasons why it is desirable to disconnect a meter under certain situations. For example, it is desirable to disconnect a meter before the meter is removed from its socket to avoid arcing that could damage the meter electronics. It is also desirable to disconnect power from a meter when servicing the lines into the meter and the corresponding breaker frame. Under certain circumstances, it is also desirable to have the capability to disconnect a meter remotely, such as when electrical service is being discontinued.

Typical remotely operated disconnect switches use a form of force generator such as a solenoid or an E-frame magnet commonly used on starters or contactors. These devices require a high level of energy for a short period of time to effectively move electrical contacts to open or close a circuit. The control systems used to power the electronics in a meter are typically solid state devices that have to go to extraordinary means to provide power levels suitable for such solenoids or E-frame magnets.

Accordingly, a need exists for an improved disconnect switch that can operate at power levels comparable to those that feed the meter electronics. Furthermore, it is desirable to have such a low power actuated switch that can be operated remotely.

SUMMARY OF THE INVENTION

These and other needs are satisfied by this invention which is directed to a low power motor operated switch which employs a clock motor to reciprocate a shuttle that, in turn, drives a plurality of moveable, electrical contacts between two stable states, open and closed. In one embodiment, the shuttle is slidably and pivotably captured at one end of a crank arm that is fixedly coupled at the other end to and is rotated by the drive shaft of the motor. Rotation of the crank reciprocates the shuttle between fully extended and withdrawn positions. A series of hinged toggle links indirectly connect the shuttle to the contacts and are spring biased in one or the other of the two stable states. The motor is remotely actuated and travels over a selected arc of rotation of the crank to transition the contacts when activated. Thus, the rotation of the crank and the spring bias toggle arrangement provides the mechanical advantage that enables a low power motor to transition the moveable contacts between a closed and open position.

In a preferred arrangement, the connection between the shuttle and the toggle links is spring biased at critical points along the shuttle's path of travel to assist the transition of the contacts from one toggle state to the other. Desirably the connection between the shuttle and the toggle links is accomplished through an internal slide that moves within a channel in the shuttle along the axis of movement of the shuttle. The ends of the toggle links are captured within a portion of the slide. Force is preferably imparted from the shuttle to the slide through an activation spring that is captured by both the slide and the shuttle. Additionally, in the preferred arrangement, the shuttle is connected to the crank in a manner that enables it to reciprocate collinear with a fixed axis, to impart the maximum force available to transition the toggle links. This movement of the shuttle to the extremes of its travel compresses the drive spring and applies the necessary force to the slide, and through the slide to the toggle links, to transition the contacts.

In another embodiment, a remote indication is provided when the contacts have made the transition. When the contacts are in the closed position, added spring bias is applied to improve electrical conduction. Desirably, the motor is operable at wattage levels comparable to those that power the meter electronics. In this way, a low current drive mechanism is able to transition the contacts and maintain good electrical continuity during meter operation.

BRIEF DESCRIPTION OF THE DRAWINGS

A full understanding of the invention can be gained from the following description of the preferred embodiments when read in conjunction with the accompanying drawings in which:

FIGS. 2A through I are schematic top views of the shuttle, slide and contactor of this invention, which illustrate the movement of the toggle linkage as the shuttle is reciprocated by the clock motor.

DESCRIPTION OF THE PREFERRED EMBODIMENTS

Figure 1:
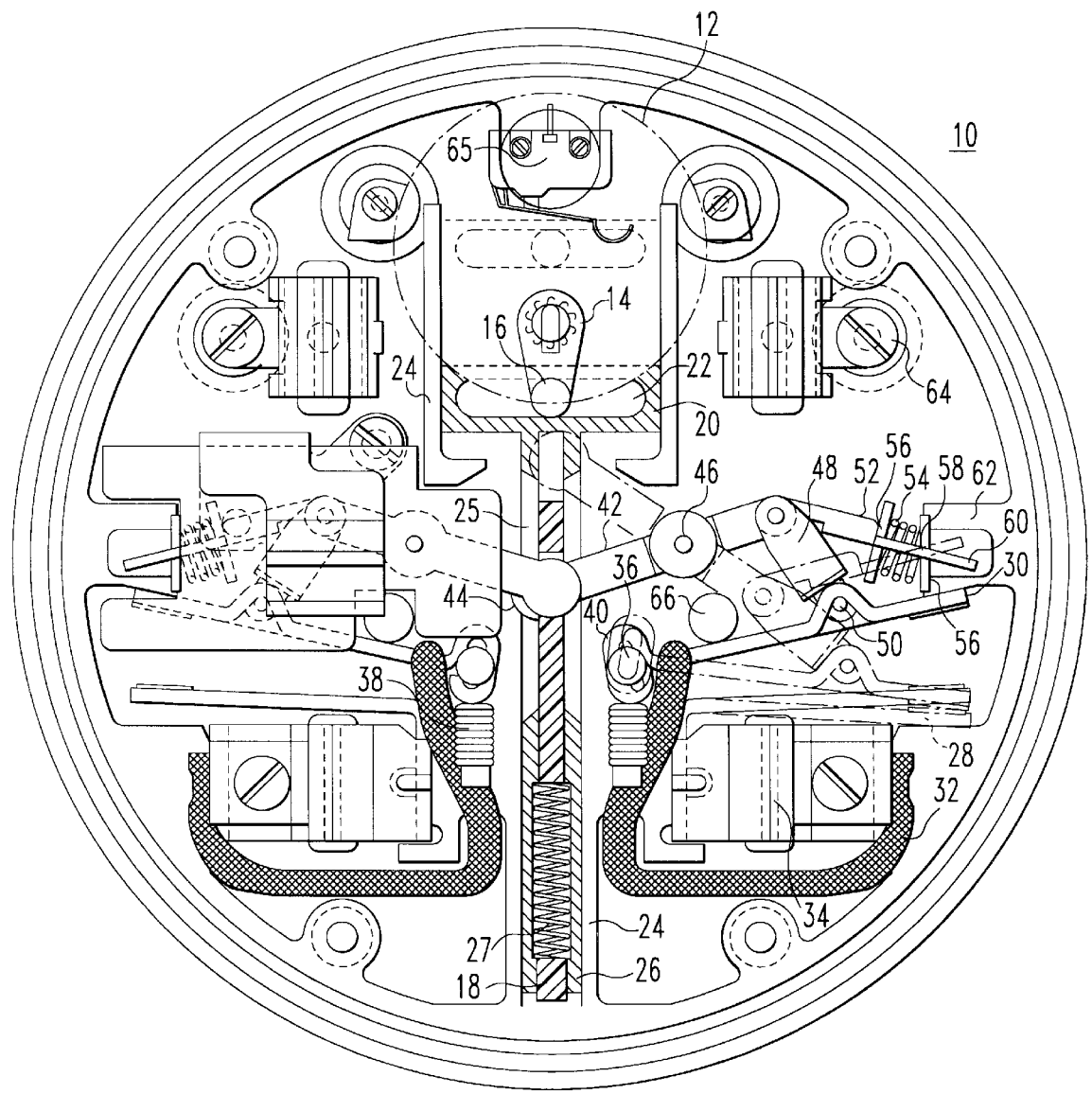
FIG. 1 is a top view of the motor operated meter switch of this invention, partially in section.
Figure 2A:
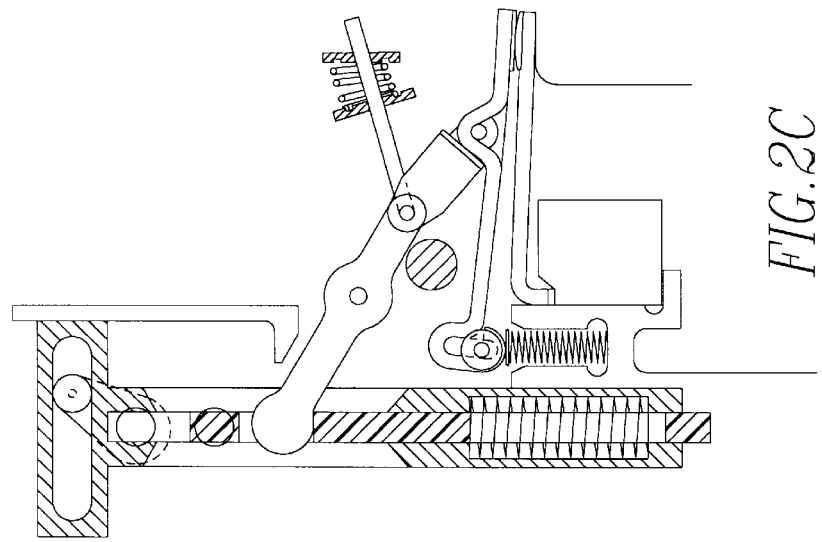
Figure 2B:
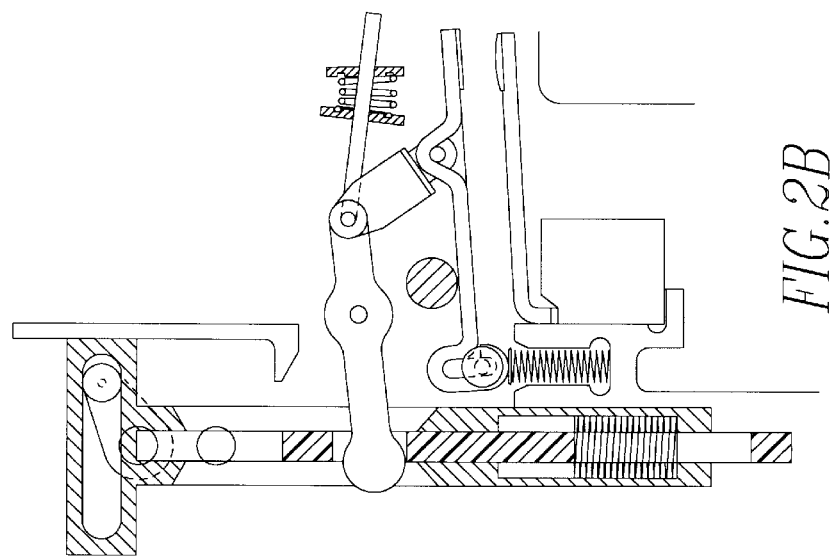
Figure 2C:
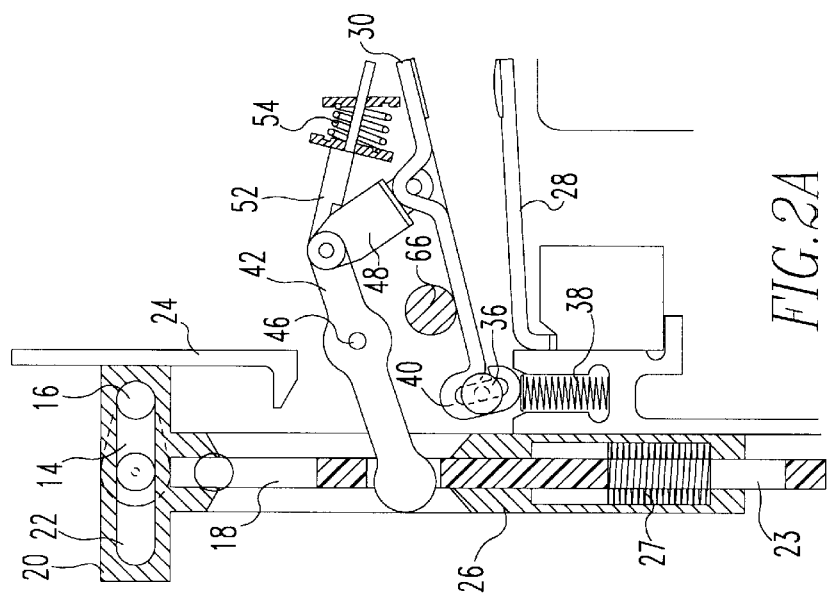
Figure 2F:
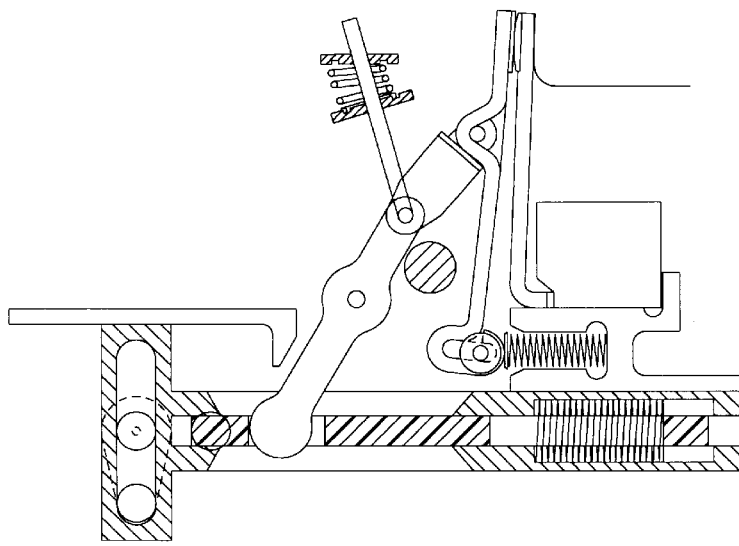
Figure 2E:
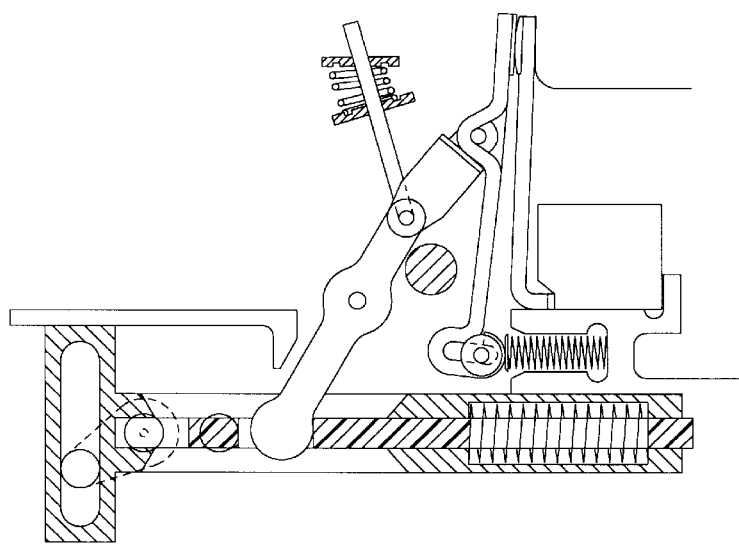
Figure 2D:
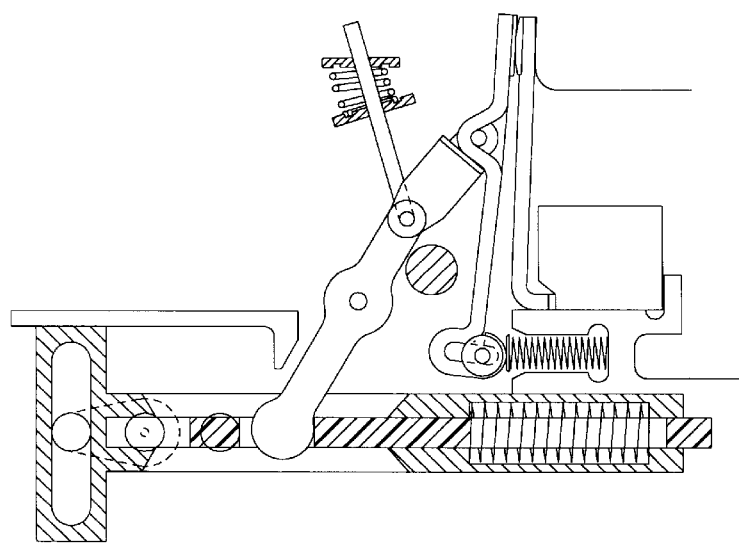

This invention takes advantage of a low energy clock motor and mechanical leverage of a bi-stable toggle arrangement to provide a low power, remotely operated disconnect switch for an electrical meter. The low power drive is provided by a clock motor 12 having a rotating armature that turns a crank 14, as shown in FIG. 1. At a point spaced from the crank's connection to the armature, the rotating crank supports a post 16, which is slidably captured within a horizontal slot 22 in the upper portion of a shuttle 20. The shuttle 20 is slidably supported at its upper end along its path of travel by the guide walls 24. The extended length of the shuttle 20 below the slot 22, includes an internal channel that houses the moveable slide 18. As the crank 14 rotates, the post 16 forces the shuttle 20 and slide 18 to move up and down within guide walls 24 as the post 16 moves back and forth within the shuttle slot 22. The channel within the shuttle 20 also includes a slide spring retainer 26 which captures an activation spring 27. The activation spring 27 is also captured within a corresponding, defined region 23 of the slide 18, which can be better appreciated by reference to FIGS. 2A–I and 3B. As the shuttle 20 is driven downward, the activation spring 27 is compressed between the upper end of the retaining section 26 of the interior channel of the shuttle 20 and the lower surface of the spring retaining section 23 of the slide 18, as can be appreciated from FIG. 2G. Similarly, as the shuttle 20 is driven upward, as in FIG. 2A, the activation spring 27 is compressed between the lower end of the shuttle 20 spring containment area 26 and the upper portion of the spring containment section 23 of the slide 18. The purpose the activation spring 27 serves will be described more fully hereafter.

The motor operated switch 10 is provided with two sets of moveable contacts; each having a stationary contact 28 and a moveable contact 30. The moveable contact 30 is provided with an elongated aperture 40 at its hinged end which is captured by a pivot pin 36 with an enlarged head. The slidable hinge 40 is an oblong opening that is biased by a recessed spring 38 that urges the moveable contact arm 30 into engagement when the contacts are closed, to assure good electrical conduction. In its open position, the moveable contact rests against a stop 66. A flexible lead 32 electrically connects the moveable contact to a female plug 34 that is designed to mate with a corresponding male component on the meter assembly. A solid connection is made between the stationary contact 28 and a male component, not shown, on the reverse side of the motor driven switch 10. The male component associated with the stationary contact is designed to mate with a corresponding female socket on the base that is connected to the power line.

An operating arm 42 extends through an opening in the walls of the shuttle 20 and is slidably captured at one end 44 within a slot in the slide 18. The operating arm 42 is also connected through a central pivot 46 to the base of the motor operated switch 10. The other end of the operating arm 42 is pivotably connected to a lower toggle link 48 which is pivotally connected at its other end 50 to the moveable contact 30. A toggle lever 52 is rotatably connected at one end to the juncture of the operating arm 42 and the lower toggle link 48. The other end 60 of the toggle lever 52 is slidably connected to an anchor 58 which captures a spring 54 between plates 56 and 58. The right hand spring capture plate 58 is held in position by a base mold feature 62. The operating arm 42, lower toggle link 48, toggle lever 52 and spring 54 form a toggle assembly having two stable states, which either places the contacts 30 and 28 in a closed or open position as will be appreciated more fully hereafter. It should also be appreciated that the other contact assembly is a mirror image of that just described.

A switch 65 is positioned over the upper portion of the shuttle 20 and is activated when the crank turns to its upward position bringing the upper surface of shuttle 20 in position to trip the lever arm of switch 65 to provide a remote indication that the motor driven switch is in the closed position. The motor is activated remotely by a latching relay which causes the shuttle to move until it hits a limit switch positioned at or just passed the point in the shuttle's 20 travel that causes the contacts to transition. Similarly, a second latching relay is activated to energize the motor 12 to move the shuttle until it hits a second limit switch positioned at the point of the cycle where the contacts again transition. Limit switch 65 can serve one of the limit switch functions. Though not shown, a similar circuit arrangement can be found in patent application Ser. No. 08/985,469, filed Dec. 5, 1997, now U.S. Pat. No. 5,905,239 issued May 18, 1999 entitled "Motor Operator With Burn-Out Protection" (Docket No. 97-PDC-433). Alternatively, a timed on cycle can be used in place of the limit switches. The motor driven switch 10 is fastened to the meter base terminals containing the power line connection, by the electrical connectors 64. The meter, in turn, is fastened to the housing of the motor driven switch 10. Thus, the motor driven switch 10 forms a plug-in-option. Each of the modules, meter, switch and base, also has a mating outwardly protruding lip at the module interfaces that are captured within a stainless steel channel ring that extends around the circumference of each mating lip pair and is locked in position with a seal to secure the modules in place.

Figures 3A, 3B:
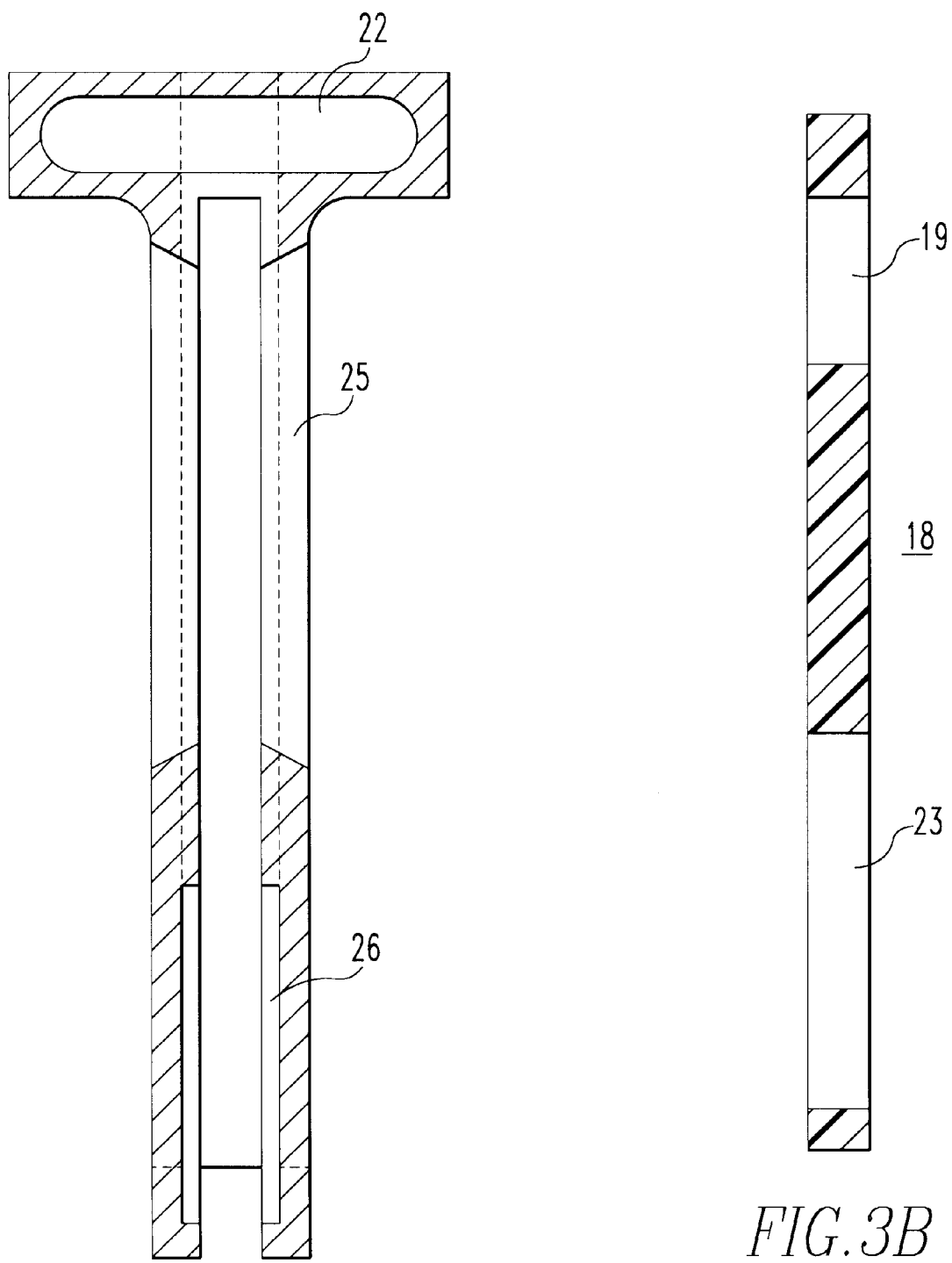
FIGS. 3A and 3B, respectively, show schematic views of the slide and shuttle of this invention.

FIGS. 2A through 2I illustrate in 30° increments the transitioning of the moveable contact 30 as the crank 14 rotates through a 360° cycle. Reference characters are provided in FIG. 2A that correspond to the reference characters illustrated in FIG. 1 for convenience, though it should be appreciated that the same reference characters apply to the corresponding individual elements illustrated in FIG. 2B through FIG. 2I. FIG. 3 provides another view of the slide 18 and shuttle 20 illustrating the opening 25 through which the operating arms 42 extend. FIG. 3B provides a better view of the extended end of the slide 18 and its spring retaining region 23 and slot 19 through which the operating arms 42 extend. As can be appreciated by reference to FIGS. 2A–I, the spring 27 reaches its maximum compressed state just prior to the transition of the contacts and assists in forcing that transition.

Accordingly, the low power clock motor of this invention uses the mechanical advantage provided by internal reduction gears to toggle the contacts 28 and 30 between open and closed positions in an application where the speed of the transitioning of the contacts is not critical. This is achieved with an assembly that is relatively inexpensive to manufacture.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalence thereof.

What is claimed is:

1. A meter having a solid state component, including a motor operated switch for disconnecting the meter from a power source, wherein the disconnect switch comprises a moveable contact for connecting the power source to the meter, a low power motor assembly for positioning the moveable contact to a first position which connects the power source to the meter or to a second position which disconnects the power source from the meter, wherein the motor assembly operates at an electrical current level of substantially the same order of magnitude as the electrical current level energizing the solid state meter component; and wherein the disconnect switch is a modular option that plugs in between the meter power source input and the power source.

2. A meter having a solid state component, including a motor operated switch for disconnecting the meter from a power source, wherein the disconnect switch comprises a moveable contact for connecting the power source to the meter, a low power motor assembly for positioning the moveable contact to a first position which connects the power source to the meter or to a second position which disconnects the power source from the meter, wherein the motor assembly operates at an electrical current level of substantially the same order of magnitude as the electrical current level energizing the solid state meter component; and wherein the moveable contact has two stable, discrete states, the first position and the second position.

3. A meter having a solid state component, including a motor operated switch for disconnecting the meter from a power source, wherein the disconnect switch comprises a moveable contact for connecting the power source to the meter, a low power motor assembly for positioning the moveable contact to a first position which connects the power source to the meter or to a second position which disconnects the power source from the meter, wherein the motor assembly operates at an electrical current level of substantially the same order of magnitude as the electrical current level energizing the solid state meter component; and including a spring operable to urge the moveable contact against a second stationary contact when the moveable contact is in a position to connect the power line to the meter.

4. A meter having a solid state component, including a motor operated switch for disconnecting the meter from a power source, wherein the disconnect switch comprises a moveable contact for connecting the power source to the meter, a low power motor assembly for positioning the moveable contact to a first position which connects the power source to the meter or to a second position which disconnects the power source from the meter, wherein the motor assembly operates at an electrical current level of substantially the same order of magnitude as the electrical current level energizing the solid state meter component; and wherein the motor operated switch is operated remotely.

5. A meter having a solid state component, including a motor operated switch for disconnecting the meter from a power source, wherein the disconnect switch comprises a moveable contact for connecting the power source to the meter, a low power motor assembly for positioning the moveable contact to a first position which connects the power source to the meter or to a second position which disconnects the power source from the meter, wherein the motor assembly operates at an electrical current level of substantially the same order of magnitude as the electrical current level energizing the solid state meter component; and wherein the motor comprises a clock motor.

6. A modular motor operated switch for connecting or disconnecting a power line to a meter having a solid state component, the motor operated switch comprising a moveable contact for connecting or disconnecting a power source to a meter, and a low power motor assembly for positioning the moveable contact to a first position which connects the power source to the meter or to a second position which disconnects the power source from the meter, wherein the motor assembly operates at a power level of substantially the same order of magnitude as the power level used to energize the solid state meter component, including a housing for seating and supporting the motor assembly and the moveable contact, with one side of a base of the housing constructed to interface with a meter socket and the other side of the housing constructed to interface with the meter, so the motor operated switch can directly plug into the meter socket and the meter can directly plug into the switch.

7. The motor operated switch of claim 6 including means for anchoring the switch to the meter socket.

8. A meter having a solid state component, including a motor operated switch for disconnecting the meter from a power source, wherein the disconnect switch comprises a moveable contact for connecting the power source to the meter, a low power motor assembly for positioning the moveable contact to a first position which connects the power source to the meter or to a second position which disconnects the power source from the meter, wherein the motor assembly operates at an electrical current level of substantially the same order of magnitude as the electrical current level energizing the solid state meter component;

wherein the motor assembly comprises:
  a motor having a rotatable shaft;
  a crank fixedly connected at a first location on the crank to the shaft;
  a shuttle operating member slidably connected at a second location on the crank, where the first location is spaced from the second location so rotation of the shaft causes the shuttle to reciprocate; and
  a toggle link having two stable positions connected at one end to the movable contact and having another end in force communication with the shuttle, wherein reciprocation of the shuttle causes the toggle to transition between its two stable states causing the movable contact to be in either the first or second position.

9. The motor assembly of claim 8 wherein the operating member moves along a linear path.

10. The motor assembly of claim 9 including
  a crank arm fixedly connected at one end to the shaft;
  a post attached to a location on the crank arm that is spaced from the end connected to the shaft; and
  wherein the operating member has an upper portion with a slot, oriented substantially perpendicular to the axis of movement of the operating member, that slidably captures the post; and
  a guide for guiding the operating member along a linear path as the shaft rotates.

11. The motor assembly of claim 10 wherein the operating member includes an internal hollow channel along its axis of movement and a spring confining region within the channel including
  an elongated sliding member, having a spring support region, slidably received within the channel and having a portion thereof in force communication with the toggle link; and
  an activation spring surrounding and captured within the spring support region of the sliding member and retained in position within the spring confining region of the channel.

12. The motor assembly of claim 8 including means for deactivating the motor after the movable contact transitions between its first and second position.

13. The motor assembly of claim 12 wherein the motor deactivating means is a timing circuit.

14. The motor assembly of claim 12 Wherein the motor deactivating means senses a predetermined degree of rotation of the crank at or after the point the contact transitions between the first and second position and turns off the motor after the transition.

* * * * *